United States Patent [19]

Yamazaki et al.

[11] 3,900,747

[45] Aug. 19, 1975

[54] DIGITAL CIRCUIT FOR AMPLIFYING A SIGNAL

[75] Inventors: Hiroshi Yamazaki; Tetsuo Ando, Tokyo, both of Japan

[73] Assignee: Sony Corporation, Tokyo, Japan

[22] Filed: July 12, 1973

[21] Appl. No.: 378,512

Related U.S. Application Data

[63] Continuation-in-part of Ser. No. 208,161, Dec. 15, 1971, abandoned.

[52] U.S. Cl............... 307/304; 307/221 C; 307/303; 357/41; 307/251

[51] Int. Cl........................... H03k 3/33; H01l 11/00

[58] Field of Search........ 307/221 C, 205, 251, 279, 307/304, 303; 317/235 D, 235 G

[56] References Cited

UNITED STATES PATENTS

| | | | |
|---|---|---|---|
| 3,573,490 | 4/1971 | Sevin | 307/304 |
| 3,575,609 | 4/1971 | Izumi | 307/304 |
| 3,591,836 | 7/1971 | Booher | 317/235 |
| 3,599,010 | 8/1971 | Crawford | 307/221 |
| 3,607,469 | 9/1971 | Madden | 317/235 |
| 3,623,132 | 11/1971 | Green | 307/251 |
| 3,631,261 | 12/1971 | Heimbigner | 307/205 |

FOREIGN PATENTS OR APPLICATIONS

| | | | |
|---|---|---|---|
| 1,189,453 | 5/1967 | United Kingdom | 317/235 |
| 1,919,641 | 4/1969 | Germany | 317/235 |

OTHER PUBLICATIONS

Gaensslen, "Complementary Four Device FET Memory Cell," IBM Tech. Discl. Bull., Vol. 13, No. 12, May 1971, pp. 3614–3615.

*Primary Examiner*—Rudolph V. Rolinec
*Assistant Examiner*—L. N. Anagnos
*Attorney, Agent, or Firm*—Lewis H. Eslinger; Alvin Sinderbrand

[57] ABSTRACT

In a digital circuit for providing an output signal at a boosted level in respect to an input signal, the source-drain circuit of a MIS field effect transistor is connected between input and output terminals and the gate of such transistor is supplied with a first clock pulse during the occurrence of the input signal, and a semiconductor substrate of one conductivity type is connected to ground and has first and second diffusion regions of the opposite conductivity type formed therein with a relatively small interval between such regions and with the second diffusion region being in the floating state, that is, devoid of any ohmic connections thereto. An insulating layer on the substrate extends from over a part of the first diffusion region over substantially the entire area of the second diffusion region and the interval therebetween and a conductive layer connected to the output terminal covers the insulating layer for forming a capacitance with the latter, and a second clock pulse which is sufficiently out of phase in respect of the first clock pulse to avoid overlapping thereof is applied to the first diffusion region so that a portion of an output signal derived at the output terminal has its level boosted in respect of an input signal applied to the input terminal by the magnitude of the second clock pulse with the pulse width of such portion being determined by the time interval from the second clock pulse to the first clock pulse.

2 Claims, 21 Drawing Figures

DIGITAL CIRCUIT FOR AMPLIFYING A SIGNAL

CROSS-REFERENCES TO RELATED APPLICATIONS

This application is a continuation-in-part of our copending U.S. Pat. application Ser. No. 208,161, filed Dec. 15, 1971, and now abandoned.

BACKGROUND OF THE INVENTION

This invention relates to a digital circuit and more particularly to a digital circuit for amplifying or boosting the level of a signal in a shift-register, a logic circuit and the like.

As digital circuits using metal-insulator-semiconductor field effect transistors (MIS FET) consume very little electricity and can be miniaturized, such circuits have recently been widely applied in electronic computers.

However, a MIS FET requires a high source voltage and an input signal of high voltage, as compared with a bipolar transistor, to prevent misoperation due to noise. Therefore, when a circuit using a bipolar transistor is combined with a circuit using a MIS FET, the signal being acted upon needs to be amplified whereby the whole circuit is complicated. Moreover, when a high source voltage and a clock pulse are supplied to a circuit including a MIS FET to prevent misoperation due to noise, consumption of electricity is undesirably increased.

BRIEF SUMMARY OF THE INVENTION

One object of this invention is to provide a simple digital circuit capable of boosting the level of an input signal.

Another object of this invention is to provide a digital circuit, as aforesaid, which avoids misoperation due to noise and operates at a high rate.

In a digital circuit according to an aspect of this invention, the source-drain circuit of a MIS field effect transistor is connected between input and output terminals and the gate of such transistor receives a first clock pulse during the occurrence of an input signal supplied to the input terminal, a grounded semiconductor substrate of one conductivity type has first and second diffusion regions of the opposite conductivity type formed therein with a small interval between such regions and with the second diffusion region being in the floating state, that is, devoid of any ohmic connections thereto, an insulating layer extends on the substrate from over a part of the first diffusion region over substantially the entire second diffusion region and the interval therebetween, a conductive layer connected to the output terminal covers the insulating layer for forming a capacitance with the latter, and a second clock pulse, which is out of phase in relation to the first clock pulse to avoid overlapping therewith, is applied to the first diffusion region so that a portion of an output signal derived at the output terminal has its level boosted relative to that of the input signal by the magnitude of the second clock pulse with the pulse width of such portion being determined by the time interval from the second clock pulse to the first clock pulse.

The above, and other objects, features, and advantages of this invention, will be apparent in the following detailed description of illustrative embodiments which is to be read in connection with the accompanying drawings.

DESCRIPTION OF THE PREFERRED EMBODIMENTS

Figure 1:
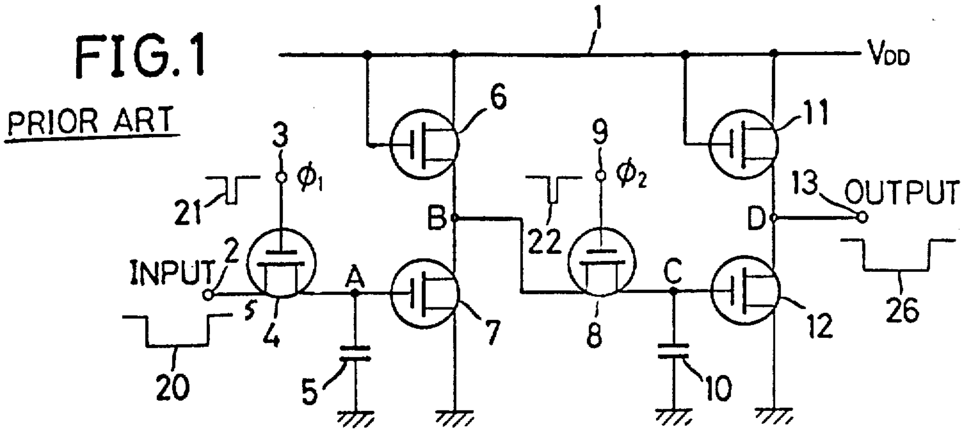
FIG.1 PRIOR ART
FIG. 1 is a circuit diagram of a prior two-phase dynamic shift register.

In a prior two-phase dynamic shift register as shown in FIG. 1, an input terminal 2 is connected to the source of a MIS FET 4 having its gate electrode connected to a terminal 3 supplying a clock pulse $\phi_1$. The drain of MIS FET 4 is connected to a condenser 5 to memorize the input signal temporarily and to the gate of a MIS FET 7.

The source-drain circuit of MIS FET 7 is connected to a line 1 supplying a negative voltage $V_{DD}$ through a MIS FET 6 functioning as a resistor. The output stage of MIS FET 7 is connected to the source-drain circuit of a MIS FET 8 having its gate electrode connected to a terminal 9 supplying a clock pulse $\phi_2$. The MIS FET 8 is connected to the gate of a MIS FET 12 through a condenser 10 and the source-drain of MIS FET 12 is connected to the line 1 supplying the voltage $V_{DD}$ through a MIS FET 11 functioning as a resistor. Moreover, the output stage of MIS FET 12 is connected to an output terminal 13 to transmit an output signal.

The operation of the above-described circuit will now be described with reference to FIGS. 2A–2G. When an input signal 20 or a logic "1" shown in FIG. 2C is applied to the input terminal 2, and a pulse 21 of clock pulse $\phi_1$ shown in FIG. 2A is applied to the terminal 3, the source-drain of MIS FET 4 is conductive.

Figures 2A, 2B, 2C, 2D, 2E, 2F, 2G:
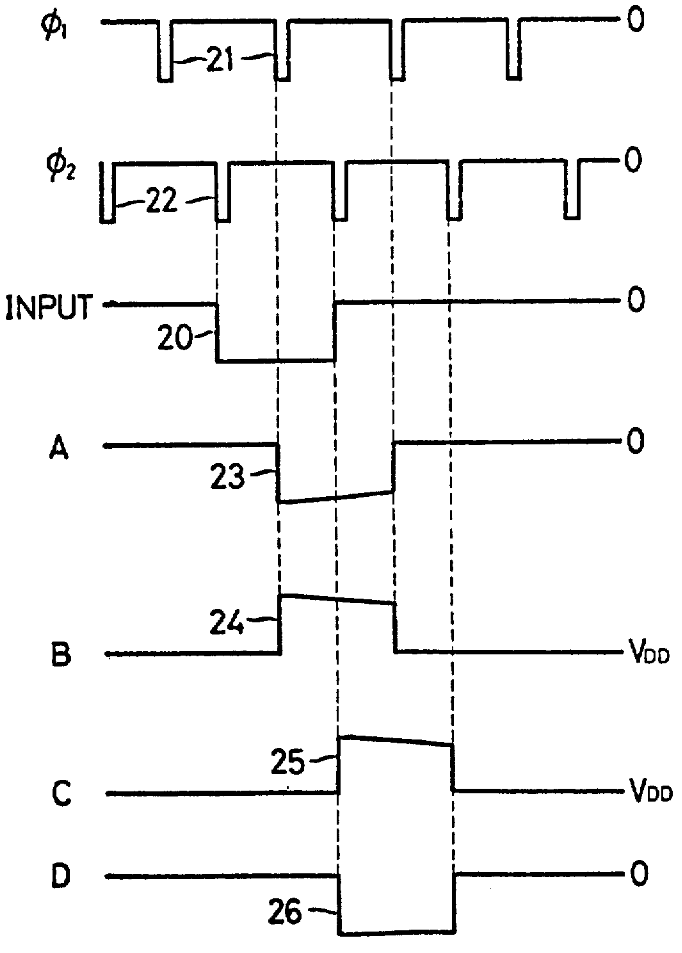
FIGS. 2A, 2B, 2C, 2D, 2E, 2F and 2G are explanatory diagrams showing the relationship of voltages or currents occurring in the circuit of FIG. 1.

Only when MIS FET 4 is in its conductive state as a result of the clock pulse 21, the condenser 5 and the gate of the MIS FET 7 are charged with the input signal 20, so that the potential at point A changes, as indicated by the wave-form 23 shown in FIG. 2D. After the condenser 5 has been charged to a level of the voltage of the input signal 20, it is partly discharged due to any leaking resistance, but the charging of the condenser 5 is held until the next pulse of clock pulse $\phi_1$ is supplied.

When the potential at point A is negative due to input signal 20 being negative, the source-drain of MIS FET 7 is conductive and the potential at point B changes, as indicated by the waveform 24 shown in FIG. 2E. When the condenser 5 is charged, that is, when MIS FET 7 is conductive, MIS FET 8 becomes conductive due to the application of a pulse 22 of clock pulse $\phi_2$ (FIG. 2B) from terminal 9 to the gate electrode of MIS FET 8 whereby condenser 10 is charged with the potential at point B, that is, with a positive potential relative to the voltage $V_{DD}$. The charging of the condenser 10 occurs while the MIS FET 8 is made conductive by the pulse 22 of clock pulse $\phi_2$.

Before the pulse 22 of clock pulse $\phi_2$ is applied, that is, before MIS FET 8 is made conductive, MIS FET 12 is conducutive, but it is changed to its nonconductive state when the potential at point C is changed in the positive direction, as indicated by the waveform 25 shown in FIG. 2F, and thus the output signal or potential at point D follows the waveform 26 shown in FIG. 2G. Such output signal obtained at terminal 13 is shifted relative to the input signal 20 by an extent equal to the interval between the pulses of clock pulse $\phi_1$ or clock pulse $\phi_2$.

It is possible to transmit an input signal by the above-described circuit and signals, but such circuit has the disadvantage that the voltage $V_{DD}$ of the line 1 and the voltages of the clock pulses $\phi_1$ and $\phi_2$ must be high enough to avoid misoperation of the circuit due to noise, so that the circuit consumes a large amount of electricity.

When avoiding misoperation as aforesaid, complications arise in combining a bipolar transistor circuit with the voltage level of about 4 volts with the MIS transistor circuit with the voltage level of about 10 volts.

The above-mentioned disadvantage can be avoided by the use of a two-phase shift register which will now be described with reference to FIG. 3.

Figure 3:
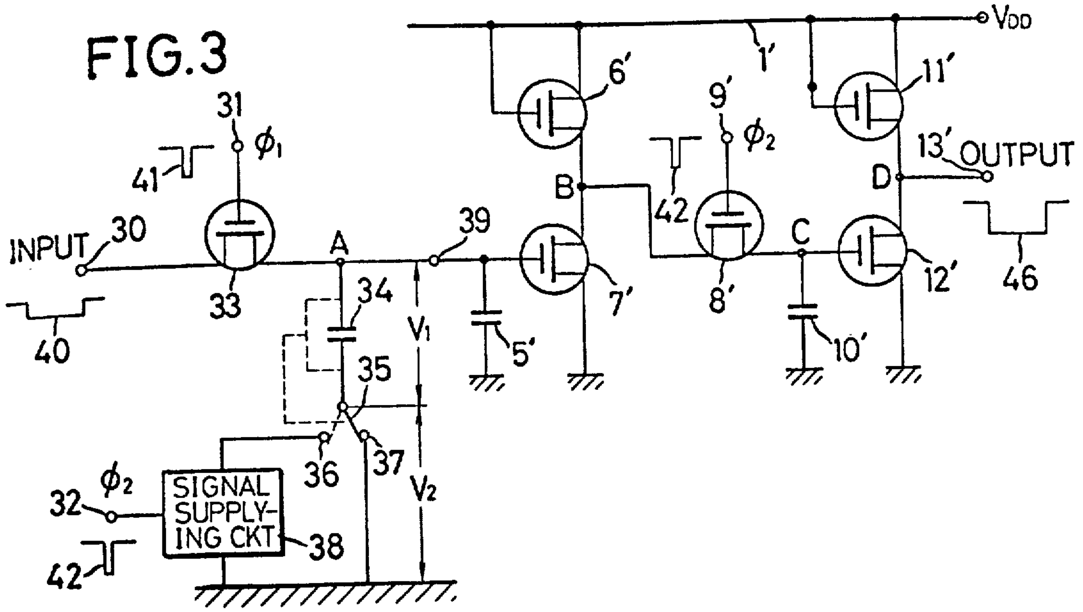
FIG. 3 is a circuit diagram of a digital circuit of a type to which this invention may be advantageously applied.

In FIG. 3, an input terminal 30, to which a logic "0" or "1" is supplied, is connected to a MIS FET 33 which is turned-on or -off by a clock pulse $\phi_1$ applied to its gate electrode from a terminal 31.

The output stage of MIS FET 33 is connected to one terminal of a condenser element 34 and to an output terminal 39. The other terminal of condenser element 34 is connected to a switch element 35.

The switch element 35 functions to engage selectively with one or the other of the switch contacts 36 and 37. The switch element 35 operates in synchronism with the charging of the condenser element 34, that is when the condenser element 34 is charged. Therefore, it is desirable for the switch element 35 to be actually constituted by a bipolar transistor or a MIS FET. The switch contact 36 is connected to a signal supplying circuit 38 which is provided with a terminal 32 receiving a clock pulse $\phi_2$.

Moreover, the output terminal 39 is connected to a shift register circuit formed by a condenser 5' and a MIS FET 7' and so on, as described with reference to FIG. 1. As this shift register circuit is the same as that shown in FIG. 1, each circuit element is identified by the same reference numeral employed in FIG. 1, but with a prime appended thereto. The operation of the circuit of FIG. 3 will now be described with reference to the waveforms shown in FIGS. 4A–4G.

Figures 4A, 4B, 4C, 4D, 4E, 4F, 4G:
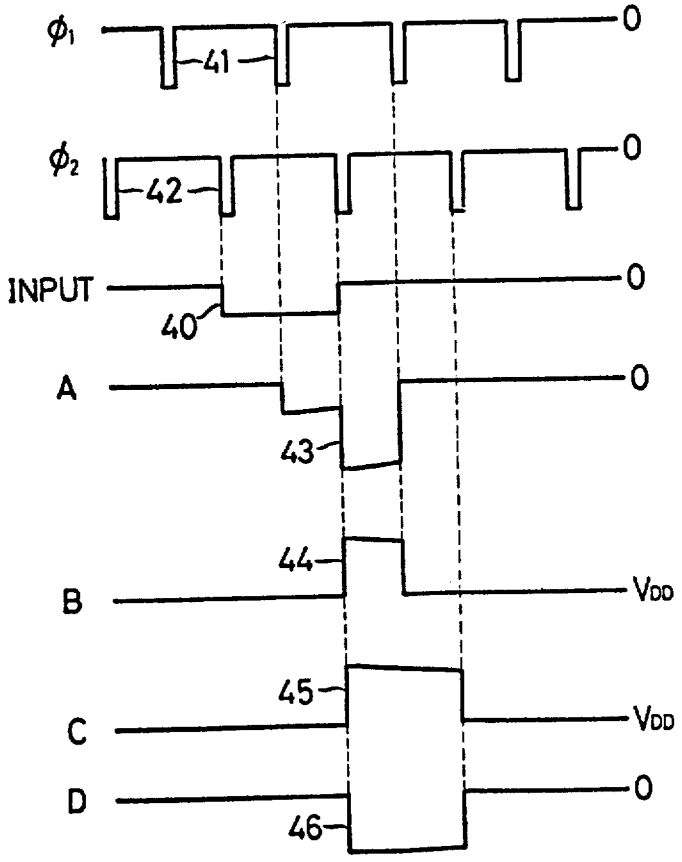
FIGS. 4A, 4B, 4C, 4D, 4E, 4F and 4G are explanatory diagrams showing the relationship of voltages or currents occurring in the circuit of FIG. 3.

When an input signal 40 or a logic "1" shown in FIG. 4C is applied to input terminal 30, and a pulse 41 of clock pulse $\phi_1$ shown in FIG. 4A is applied to terminal 31, MIS FET 33 becomes conductive and input signal 40 is transmitted forwards. In the conductive state of MIS FET 33, condenser 34 is charged by input signal 40 to the same level as the latter. During the charging of condenser 34, switch element 35 remains engaged with the contact 37 connected to ground. With the charging of condenser 34, the potential at point A changes in accordance with the left half of the waveform 43 shown in FIG. 4D.

When condenser element 34 has been charged, switch element 35 is engaged with the contact 36 as shown by a dotted line. The change-over of switch element 35 is automatically performed in response to the charging of condenser element 34. When a pulse 42 of clock pulse $\phi_2$ shown in FIG. 4B is applied to terminal 32, the potential of the pulse 42 of clock pulse $\phi_2$ is applied to condenser element 34 through the signal supplying circuit 38. Thus, the potential at point A is increased by the voltage level of the pulse 42 of clock pulse $\phi_2$ as shown by the right-hand portion of the waveform 43 in FIG. 4D. The resulting signal at the increased level is transmitted forwards through the output terminal 39.

If the voltage of input signal 40 is 4 volts, and the voltage of the pulse 42 of clock pulse $\phi_2$ is 10 volts, a signal of about 14 volts is obtained at output terminal 39, so that condenser 5' following output terminal 39 is charged to a level of about 14 volts, and the voltage of about 14 volts is applied to the gate electrode of MIS FET 7'.

MIS FET 7' is nonconductive at the gate voltage of 4 volts, while it is conductive at the gate voltage of 14 volts. When MIS FET 7' is conductive, the potential at point B changes in accordance with a waveform 44 shown in FIG. 4E. The positive potential shown by waveform 44 continues, till the next pulse 41 of clock pulse $\phi_1$ is applied to terminal 31. When the next pulse 41 of clock pulse $\phi_1$ is applied to terminal 31, MIS FET 33 becomes conductive, point A is grounded through MIS FET 33, condenser 5' is discharged, and MIS FET 7' is rendered nonconductive.

When the potential at point B becomes the waveform 44 shown in FIG. 4E, and the pulse 42 of clock pulse $\phi_2$ is applied to the gate electrode of MIS FET 8' through terminal 9', the MIS FET 8' becomes conductive, and condenser 10' is charged by the potential at point B, and the potential at point C becomes the waveform 45 shown in FIG. 4F. When the potential at point C reaches the level of the waveform 45, a potential is applied to the gate electrode of MIS FET 12', so that MIS FET 12', which has been conductive, becomes nonconductive, and the potential at point D becomes the waveform 46 shown in FIG. 4G. The nonconductive state of MIS FET 12' continues, till the next pulse 42 of clock pulse $\phi_2$ is applied.

Consequently, an output signal 46 shifted relative to the input signal 40 is obtained from output terminal 13'.

The case in which the input signal is a logic "1" has been described above. In the case in which the input signal is a logic "0," condenser element 34 is not charged, and thus switch element 35 is not engaged with the contact 36. Therefore, even if the pulse 42 of clock pulse $\phi_2$ applied to terminal 32 has a potential of 10 volts, the potential at point A does not rise, and thus MIS FET 7' does not become conductive.

As is apparent from the above description, the level of the signal of a logic "0" is not boosted, while the level of the signal of a logic "1" is boosted. Therefore, the difference between the level of a signal of logic "0" and the level of a signal of logic "1" is large. Consequently, misoperation due to noise is avoided. Further, it is possible to increase the operating speed of the circuit by the boost or increase in the level of the signal. Moreover, it is possible to directly connect a signal circuit with a low voltage level, for instance, to connect a bipolar transistor circuit with a 4 volt level to a MIS FET circuit with a 14 volt level.

A digital circuit comprising a MIS integrating circuit will now be described with reference to FIGS. 5, 6, 7A and 7B.

Figure 5:
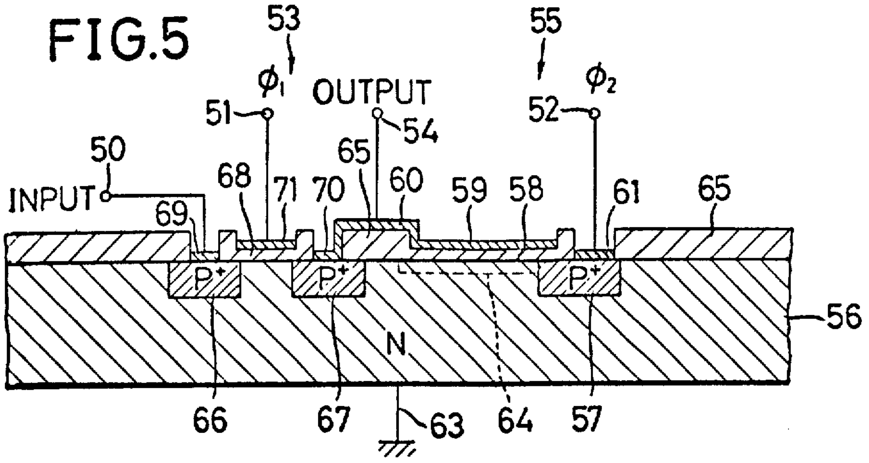
FIG. 5 is a sectional view of a structural embodiment of an integrated digital circuit of a type to which this invention may be advantageously applied.

Such MIS integrating circuit is shown to be provided with a MIS FET 53 disposed at the left hand portion of FIG. 5, and a voltage level converting element 55 disposed at the right hand portion of FIG. 5. Practically, many other elements may be disposed on an N-type semicondctor substrate 56, but are not shown in the drawing.

A $P^+$-type semiconductor region 66 which functions as the source of MIS FET 53 is formed on the left hand portion of the N-type semiconductor substrate 56. A source electrode 69 is disposed on the $P^+$-type semiconductor region 66 and is connected to an input terminal 50.

A $P^+$-type semiconductor region 67 functioning as a drain is formed on substrate 56 a small distance toward the right, as viewed, from the $P^+$-type semiconductor region 66, and a drain electrode 70 is disposed on the $P^+$-type semiconductor region 67. A wire 60 is connected to the drain electrode 70. An insulating layer 68, on which a gate electrode 71 is disposed, is formed on the surface of N-type semiconductor substrate 56 between the $P^+$-type semiconductor regions 66 and 67. The gate electrode 71 is connected to a terminal 51 to supply the clock pulse $\phi_1$. A $P^+$-type semiconductor region 57, on which an electrode 61 is disposed, is formed by diffusion in the right hand portion of the $N^+$-type semiconductor substrate 56. The electrode 61 is connected to a terminal 52 to supply the clock pulse $\phi_2$.

A comparatively thin insulating layer 58, on which a metal electrode 59 is disposed, extends from over a part of $P^+$-type semiconductor region 57 over the $N^+$-type semiconductor substrate 56 to a comparatively thick insulating layer 65 which extends onto $P^+$-type region 67. A wire 60 extends from drain electrode 70 over thick insulating layer 65 to metal electrode 59, and such wire 60 is connected to an output terminal 54. Further, substrate 56 is connected to ground, as at 63.

Figure 6:
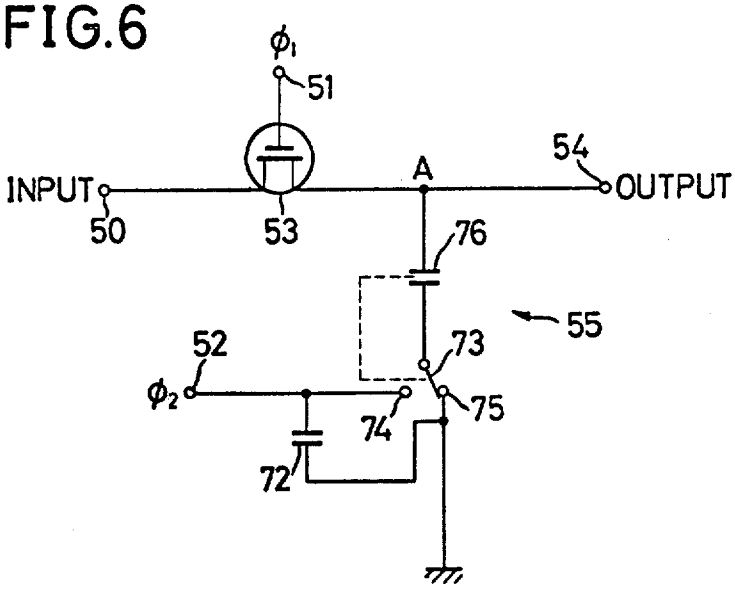
FIG. 6 is an equivalent circuit diagram of the digital circuit shown in FIG. 5.

An electrical equivalent circuit of the above-described MIS integrating circuit is shown in FIG. 6, in which the capacity of the MIS formed by metal electrode 59, insulating layer 58 and N-type semiconductor substrate 56 is represented by a condenser 76 and a channel 64 formed by application of a bias voltage to metal electrode 59 is represented by a switch 73. Further, in FIG. 6, a depletion layer formed by application of the negative clock pulse $\phi_2$ to terminal 52 is represented by a condenser 72. Moreover, existence or nonexistence of the channel 64 is represented in FIG. 6 by the connection of switch 73 to a contact point 74 or to a contact point 75.

The operation of the MIS integrating circuit of FIGS. 5 and 6 will now be described with reference to FIGS. 7A and 7B, in addition to FIGS. 4A–4G. 4A –

Figure 7A:
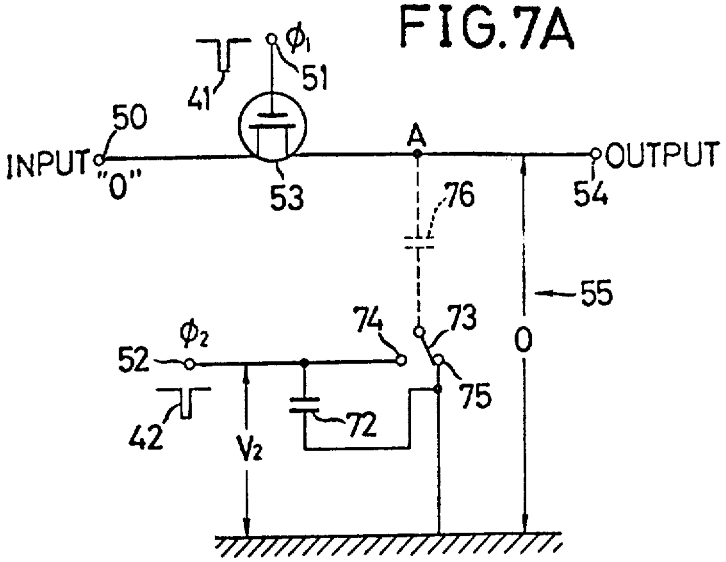
FIG. 7A is an equivalent circuit diagram of the digital circuit shown in FIG. 5 when an input signal is a logic "0"

FIG. 7A shows the circuit when the input signal is a logic "0." As a negative voltage is not supplied to input terminal 50 when the input signal is a logic "0," no potential is supplied to point A even when MIS FET 53 becomes conductive by application of a clock pulse 41 to terminal 51. Therefore, condenser 76, shown by dotted lines in FIG. 7A, is not charged. When condenser 76 is not charged, the channel 64 is not formed. Consequently, even when a clock pulse 42 of $V_2$ volts is applied to $P^+$-type semiconductor region 57 through terminal 52, the level of a logic "0," or the level at point A does not change.

Figures 7B, 8:
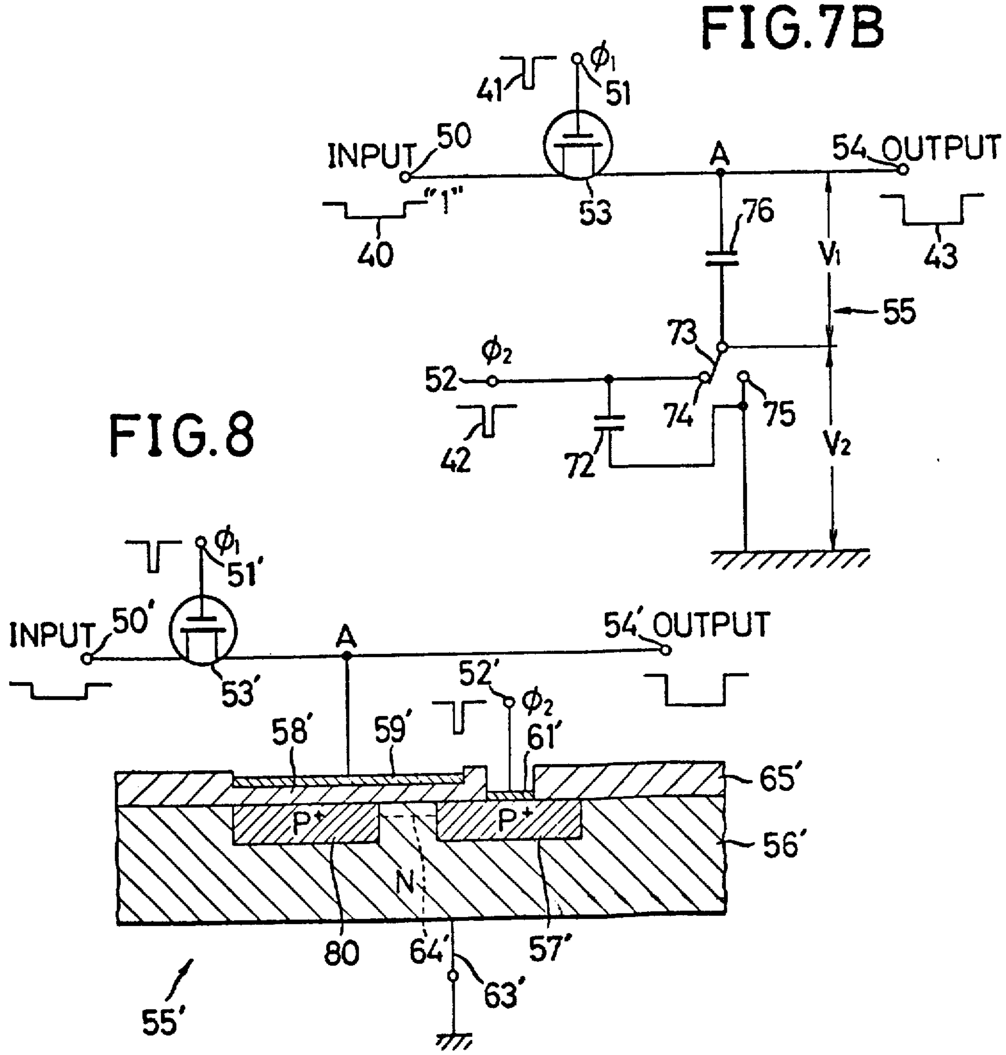
FIG. 7B is an equivalent circuit diagram of the digital circuit shown in FIG. 5 when an input signal is a logic "1"
FIG. 8 is a combined circuit diagram and sectional view of an embodiment of a digital circuit according to this invention.

FIG. 7B shows the circuit when the input signal is a logic "1." The input signal 40 shown in FIG. 4C is supplied to input terminal 50 when the input signal is a logic "1," according to negative logic. In that case, MIS FET 53 becomes conductive upon supplying of the pulse 41 of clock pulse $\phi_1$ to terminal 51, and thus a signal "1" is transmitted to point A. The condenser 76 formed by insulating layer 58 is charged to $V_1$ volts by the signal "1" of $V_1$ volts, so that holes are accumulated in the surface region of N-type semiconductor substrate 56 under insulating layer 58, whereby the inversion layer or channel 64 is formed. The existence of the channel 64 corresponds to the connection of switch 73 to contact point 74, and therefore condenser 72 and terminal 52 are connected to the circuit. When the pulse 42 of clock pulse $\phi_2$ having the level of $V_2$ volts is applied to terminal 52, the potential of $P^+$-type region 57 becomes negative, so that holes in channel 64 are injected into the $P^+$-type semiconductor region 57 to there form the depletion layer.

In other words, condenser 72 due to the depletion layer formed in response to the clock pulse $\phi_2$ of $V_2$ volts is formed in N-type semiconductor substrate 56, so that condenser 76 due to insulating layer 58 between the N-type semiconductor substrate 56 and metal electrode 59 is combined, in series, with the condenser 72 due to the depletion layer. Therefore, the potential of point A is the result of the addition of the input signal 40 of $V_1$ volts to the clock pulse 42 of about $V_2$ volts. Thus, the level of a logic "1" is boosted to about $(V_1+V_2)$ from $V_1$.

With the above-described MIS integrating circuit, the level of logic "0" is unchanged, while the level of a logic "1" is boosted whereby there is no misoperation due to noise. Moreover, by utilizing the voltage level converting element 55 it is possible to directly combine the integrating circuit of the bipolar transistor with the integrating circuit of the MIS FET.

A digital circuit according to this invention which is generally similar to that shown in FIG. 5 will now be described with reference to FIG. 8 in which elements corresponding to those described with reference to FIG. 5 are identified by the same reference numerals, but with primes appended thereto. In FIG. 8, the MIS FET 53' is shown formed separately from the voltage level converting element 55', but it will be apparent that such MIS FET 53' can be formed on the same semiconductor substrate as the element 55' similar to the arrangement of the MIS FET 53 and the element 55 in FIG. 5.

In accordance with the present invention, the digital circuit of FIG. 8 is provided with an additional $P^+$-type semiconductor region 80 diffused or formed in the N-type semiconductor substrate 56' under the insulating layer 58' and is spaced from the region 57' by only a small distance or interval. The region 80 is shown to be in a floating state, that is, devoid of any ohmic contacts or connections thereto.

With the digital circuit of FIG. 8 according to this invention, when a signal of a logic "0" is applied to input terminal 50' and a clock pulse $\phi_1$ is applied to terminal 51', the MIS FET 53' becomes conductive, but the potential at point A does not change due to the logic "0" and the channel 64' is not formed under the insulating layer 58' between regions 80 and 57'. Consequently, even when a clock pulse $\phi_2$ is applied to terminal 52', the potential at point A does not change.

When a signal of a logic "1" is applied to input terminal 50', and clock pulse $\phi_1$ is applied to terminal 51', MIS FET 53' becomes conductive and a negative voltage of a logic "1" is applied to the metal electrode 59', so that the channel 64' is formed between $P^+$-type semiconductor region 80 and $P^+$-type semiconductor region 57'. At the same time, the condenser due to insulating layer 58' is charged to a voltage due to a logic "1," for instance, $V_1$ volts. Thus, when a negative clock pulse $\phi_2$ is applied to $P^+$-type semiconductor 57' through terminal 52', holes in the $P^+$-type semiconductor region 80 and the channel 64' are attracted by the negative voltage of clock pulse $\phi_2$, so that depletion layers are formed between the $P^+$-type semiconductor region 80 and the $N^+$-type semiconductor region 56', and between the channel 64' as well as $P^+$-type semiconductor region 57' and the $N^+$-type semiconductor region 56'. The moving velocity of the holes in the $P^+$-type semiconductor region 80 is about three times as great as that in the channel 64' and therefore the level can be boosted at a higher rate than by the voltage level converting element 55 shown in FIG. 5. The above-mentioned depletion layers function as a condenser, and the potential of such condenser nearly equals that of the clock pulse $\phi_2$. Consequently, the condenser due to the insulating layer 58' is combined in series with the condenser due to the depletion layer, and the level of a logic "1" is boosted by the level of the clock pulse $\phi_2$. It will further be apparent that pulse width of the output signal at such boosted level is determined by the period between the successive pulses 42 of the clock pulse $\phi_2$.

Although a preferred embodiment of this invention has been described in detail with reference to the accompanying drawings, it is to be understood that the invention is not limited to that precise embodiment as shown and described, and that various changes and modifications can be made therein by one skilled in the art. For example, the voltage level converting circuit may be multistage. Further, this invention is not limited in its application to the shift register, but it is possible to apply it to different circuits for boosting the level of the signal.

What is claimed is:

1. A digital circuit for providing an output signal at a boosted level with respect to an input signal, comprising input and output terminals for respectively receiving the input signal and delivering the output signal, a MIS field effect transistor having a source-drain circuit connected between said input and output terminals, means for supplying a first clock pulse to the gate electrode of said MIS field effect transistor during the occurrence of said input signal, a semiconductor substrate of one conductivity type connected to ground, first and second diffusion regions of the opposite conductivity type formed in said substrate with a relatively small interval between said regions and with said second diffusion region being in an electrically floating state, an insulating layer on said substrate extending from over a part of said first diffusion region and over substantially the entire area of said second diffusion region and said interval, a conductive layer covering said insulating layer for forming a capacitance with the latter, means connecting said conductive layer to said output terminal, and means for supplying a second clock pulse to said first diffusion region, said first and second clock pulses being sufficiently different in phase to avoid overlapping thereof and the time interval from said second clock pulse to said first clock pulse determining the pulse width of a portion of said output signal, which is boosted with respect to said input signal by the magnitude of said second clock pulse.

2. A digital circuit according to claim 1; in which the source and drain of said MIS field effect transistor are constituted by additional diffusison regions formed in said substrate.

* * * * *